(12) United States Patent  
Aya et al.

(10) Patent No.: US 9,188,872 B2  
(45) Date of Patent: Nov. 17, 2015

(54) METHOD FOR MANUFACTURING SEMICONDUCTOR DEVICE

(71) Applicant: Mitsubishi Electric Corporation, Tokyo (JP)

(72) Inventors: Sunao Aya, Tokyo (JP); Shozo Shikama, Tokyo (JP); Hideaki Yuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/242,057

(22) Filed: Apr. 1, 2014

(65) Prior Publication Data

US 2014/0370445 A1     Dec. 18, 2014

(30) Foreign Application Priority Data

Jun. 13, 2013 (JP) ................................. 2013-124352

(51) Int. Cl.  
G03F 7/30       (2006.01)  
G03F 7/20       (2006.01)

(52) U.S. Cl.  
CPC ............... *G03F 7/3021* (2013.01); *G03F 7/20* (2013.01); *G03F 7/30* (2013.01)

(58) Field of Classification Search  
CPC ....................................................... G03F 7/30  
See application file for complete search history.

(56) References Cited

U.S. PATENT DOCUMENTS

| 6,706,321 B2 | 3/2004 | Nishiya et al. |
| 2001/0050050 A1 | 12/2001 | Nishiya et al. |
| 2007/0264007 A1 | 11/2007 | Kitahara et al. |

FOREIGN PATENT DOCUMENTS

| GB | 1388528 | * | 3/1975 |
| JP | H05-119482 A | | 5/1993 |
| JP | H06-349725 A | | 12/1994 |
| JP | H10-232498 A | | 9/1998 |
| JP | H11-329960 A | | 11/1999 |
| JP | 2000-321786 A | | 11/2000 |
| JP | 2002-075854 A | | 3/2002 |
| JP | 2002-184679 A | | 6/2002 |
| JP | 3708433 B2 | | 8/2005 |
| JP | 2007-305864 A | | 11/2007 |
| JP | 2009-004597 A | | 1/2009 |
| JP | 2013-055192 A | | 3/2013 |
| KR | 10-2001-0112595 A | | 12/2001 |

OTHER PUBLICATIONS

An Office Action issued by the Korean Patent Office on Jun. 5, 2015, which corresponds to Korean Patent Application No. 10-2014-0066775 and is related to U.S. Appl. No. 14/242,057; with English language partial translation.

(Continued)

*Primary Examiner* — Kathleen Duda  
(74) *Attorney, Agent, or Firm* — Studebaker & Brackett PC

(57) ABSTRACT

A method for manufacturing a semiconductor device includes a photolithography process having steps of a developing solution immersing process. The steps of the developing solution immersing process includes step (a) of dropping a developing solution on a silicon carbide semiconductor substrate and forming a developing solution film so as to have a film thickness of more than 6 μm and step (b) of reducing the film thickness of the developing solution film to 6 μm or less.

7 Claims, 3 Drawing Sheets

(56) References Cited

OTHER PUBLICATIONS

Niranjan Sahu et al.; "Fundamental understanding and modeling of spin coating process: A review"; IJP; Indian J. Phys.; 2009; pp. 493-502; 83 (4).

An Office Action; "Notification of Reason(s) for Refusal," issued by the Japanese Patent Office on Sep. 29, 2015, which corresponds to Japanese Patent Application No. 2013-124352 and is related to U.S. Appl. No. 14/242,057; with English language partial translation.

* cited by examiner

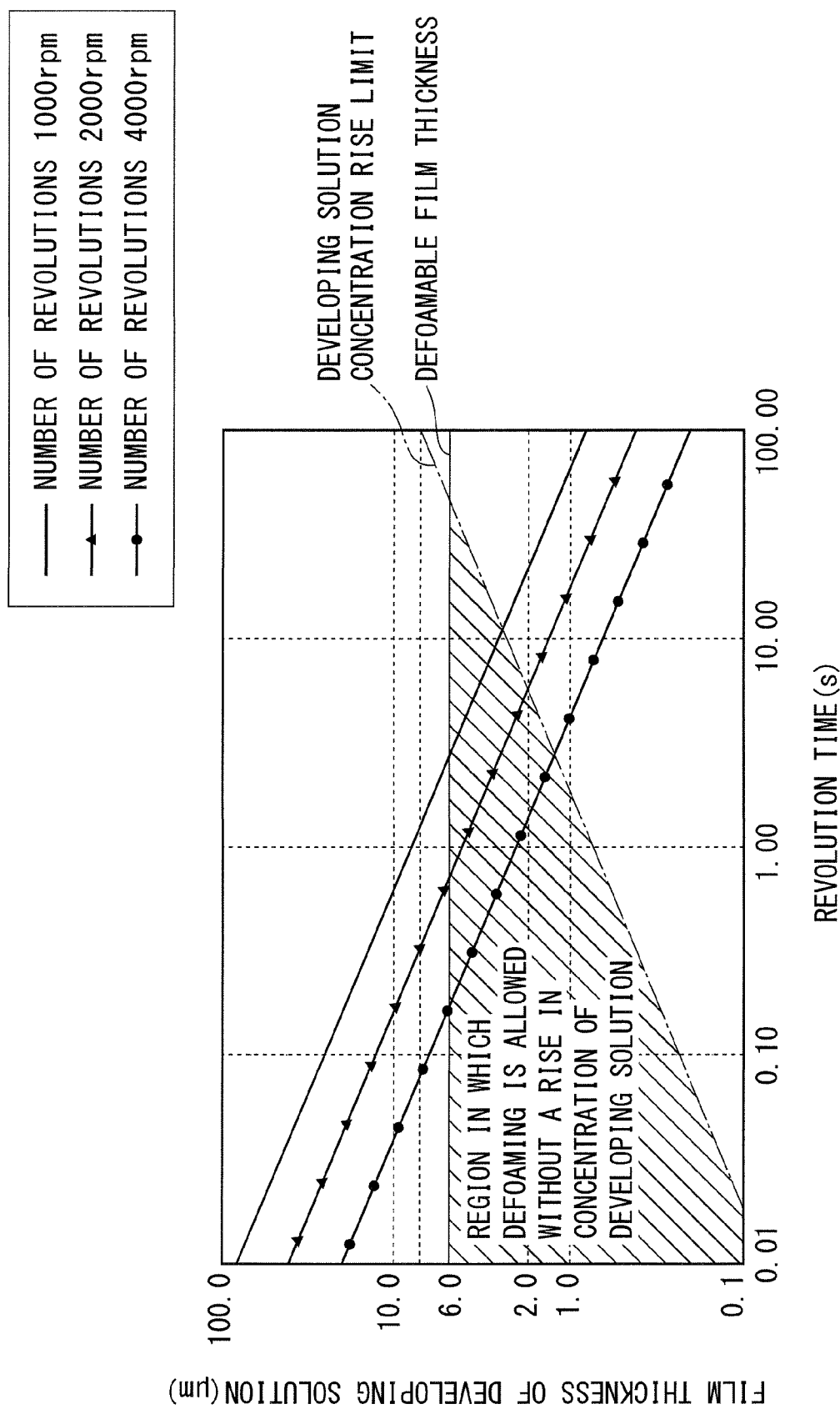
F I G. 2

METHOD FOR MANUFACTURING SEMICONDUCTOR DEVICE

BACKGROUND OF THE INVENTION

1. Field of the Invention

The present invention relates to a technique capable of reducing microbubbles causing pattern defects in a method for manufacturing a semiconductor device including a photolithography process.

2. Description of the Background Art

In the method for manufacturing a semiconductor device, a resist pattern formation that is an important microfabrication process in the photolithography process is composed of substeps below. (1) First, a photoresist (photosensitive material) is applied to a surface of a semiconductor substrate to form a photoresist film. (2) Next, a mask is used in an ultraviolet exposure device to print a circuit pattern in the photoresist film. (3) Lastly, a development processing step of the photoresist film is performed, and the resist pattern formation is completed.

The development processing step is composed of steps below. (4) First, the photoresist film on which the circuit pattern is printed is immersed in a developing solution. (5) Next, it is immersed in a development stopping solution (rinse solution) such as pure water, and the developing solution is replaced with the rinse solution to stop development. (6) Lastly, the semiconductor substrate is rotated to disperse the rinse solution to be dried.

In step (4) of developing solution immersing process, after or while dropping the developing solution on the semiconductor substrate, the semiconductor substrate is rotated to spread the developing solution entirely on a top surface of the semiconductor substrate in many cases. At this time, air might be taken in. Moreover, the developing solution may be pressurized with nitrogen or air to drop the developing solution. Meanwhile, the nitrogen may be dissolved into the developing solution, and after the developing solution is dropped, the pressure on the developing solution decreases to the atmospheric pressure, whereby the nitrogen dissolved in the developing solution may foam. Furthermore, in a case of exposing a positive-type photoresist including a novolak resin, the nitrogen is released during a photosensitive reaction and taken into the photoresist film before development, so that it may foam when being immersed in the developing solution.

Because of the multiple factors mentioned above, when the developing solution is dropped on the surface of the photoresist film, microbubbles (bubbles) are generated in the developing solution film. Some of the microbubbles adhere to the surface of the photoresist film. The adhered microbubbles prevent the developing solution from coming in contact with the photoresist film, induce development defects, cause pattern defects, and reduce yields of the semiconductor device. Japanese Patent No. 3708433 (2005) discloses the manufacturing method that removes the microbubbles and enhances production efficiency of a semiconductor device.

The manufacturing method disclosed in Japanese Patent No. 3708433 (2005) is a method for manufacturing a semiconductor device that drops the developing solution on the semiconductor substrate and develops the photoresist film formed on the semiconductor substrate to solve the problem above. The method for manufacturing the semiconductor device includes a first step, a second step, and a third step. In the first step, the developing solution is dropped on the semiconductor substrate while making the semiconductor substrate rotate at a velocity of 100 to 500 rpm and the surface wettability of the semiconductor substrate is enhanced. In the second step, the developing solution is stopped to drop and the semiconductor substrate is rotated at a velocity of 500 to 1500 rpm. In the third step, the developing solution is dropped again while making the semiconductor substrate remain at rest or rotating it at a velocity of 100 rpm or less, and after puddling the developing solution on the semiconductor substrate, the rinse solution is dropped on the semiconductor substrate and the developing solution is washed out.

In the manufacturing method disclosed in Japanese Patent No. 3708433 (2005), the first step is capable of significantly reducing the bubbles to be generated at the time of dropping the developing solution, the second step is capable of reducing pattern defects generated because the bubbles originally existing in the developing solution remain at the same place after a lapse of predetermined time, and the third step is capable of reducing the bubbles to be generated at the time of dropping the developing solution on the semiconductor substrate.

Unfortunately, the inventors of the present invention ensures that even if the development processing steps in the manufacturing method disclosed in Japanese Patent No. 3708433 (2005) are performed, the generation of the microbubbles cannot be reduced in some cases at the time of dropping the developing solution, whereby pattern defects cannot be reduced in some cases. It is desirable to improve this point and improve yields particularly in manufacturing a silicon carbide semiconductor device in which a wafer is expensive.

SUMMARY OF THE INVENTION

It is an object of the present invention to provide a method for manufacturing a semiconductor device capable of further reducing microbubbles generated at the time of dropping a developing solution and further reducing pattern defects, and adequate for manufacturing a silicon carbide semiconductor device.

A method for manufacturing a semiconductor device according to the present invention is a method for manufacturing a semiconductor device including a photolithography process. The photolithography process includes a developing solution immersing process. The developing solution immersing process includes step (a) of dropping a developing solution on a semiconductor substrate and forming a developing solution film so as to have a film thickness of more than 6 μm, and step (b) of reducing the film thickness of the developing solution film to 6 μm or less.

According to the present invention, steps of a developing solution immersing process includes step (a) of dropping a developing solution on a semiconductor substrate and forming a developing solution film so as to have a film thickness of more than 6 μm, and step (b) of reducing the film thickness of the developing solution film to 6 μm or less. Therefore, to reduce the developing solution film to 6 μm or less which is smaller than the size of microbubbles adhered at the time of dropping the developing solution on the semiconductor substrate, the microbubbles in the developing solution film can be further reduced, and thus the pattern defects can be further reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a relationship diagram between the number of revolutions of a spin chuck and a film thickness of a developing solution film.

DESCRIPTION OF THE PREFERRED EMBODIMENTS

First Preferred Embodiment

Figure 1A:
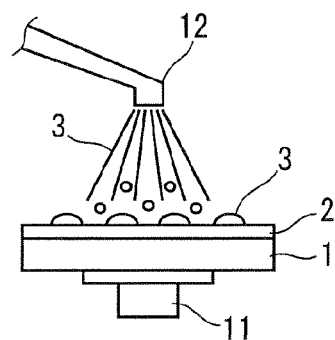
FIGS. 1A, 1B, 1C, and 1D are diagrams showing a method for manufacturing a semiconductor device according to a first preferred embodiment.
Figure 1B:
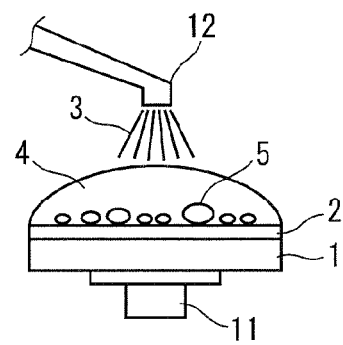
Figure 1C:
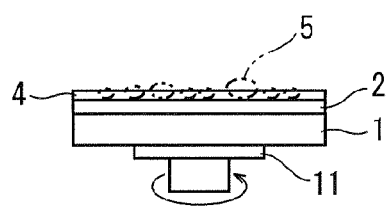
Figure 1D:
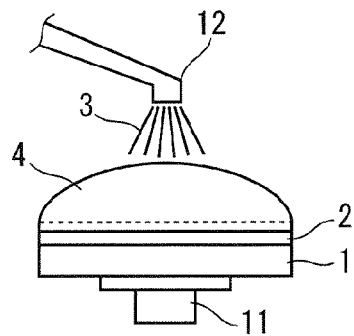

A first preferred embodiment of the present invention is described below with reference to diagrams. FIGS. 1A, 1B, 1C, and 1D are diagrams showing a method for manufacturing a semiconductor device (for example, a silicon carbide semiconductor device) according to the first preferred embodiment, more specifically, showing steps of a developing solution immersing process in a photolithography process. FIG. 1A is a diagram showing a step of dropping a developing solution 3. FIG. 1B is a diagram showing a state in which a developing solution film 4 is formed in the step of dropping the developing solution 3. FIG. 1C is a diagram showing a step of rotating a silicon carbide semiconductor substrate 1. FIG. 1D is a diagram showing a step of dropping the developing solution 3 again. The method for manufacturing the silicon carbide semiconductor substrate is provided with the photolithography process having the steps of the developing solution immersing process. The steps of the developing solution immersing process are described below.

As shown in FIG. 1A, the silicon carbide semiconductor substrate 1 is fixed on a spin chuck 11 by means of vacuum force and a photoresist film 2 is formed on the silicon carbide semiconductor substrate 1. The developing solution 3 is dropped from a nozzle 12 on the silicon carbide semiconductor substrate 1 on which the photoresist film 2 is formed. As shown in FIG. 1B, the developing solution 3 is sufficiently puddled on the silicon carbide semiconductor substrate 1 so as to form the developing solution film 4 having a film thickness of more than 6 µm (step (a)). At this time, microbubbles 5 are generated in the developing solution film 4, and some of the microbubbles 5 adhere to a surface of the photoresist film 2. In step (a), a motor (not shown) connected to the spin chuck 11 is rotated, and the silicon carbide semiconductor substrate 1 may be rotated or may be remained at rest without rotating.

Subsequently, as shown in FIG. 1C, the motor connected to the spin chuck 11 is rotated to rotate the silicon carbide semiconductor substrate 1. The silicon carbide semiconductor substrate 1 is rotated to push outward a surface side of the developing solution film 4 on the silicon carbide semiconductor substrate 1 in order to reduce the film thickness of the developing solution film 4 (step (b)). Here, the film thickness of the developing solution film 4 is reduced to 6 µm or less, more specifically, in a range of 1 µm to 6 µm.

Next, the reason why the film thickness of the developing solution film 4 is in the range of 1 µm to 6 µm is described with reference to FIG. 2. FIG. 2 is a relationship diagram between the number of revolutions of the spin chuck 11 (silicon carbide semiconductor substrate 1) and the film thickness of the developing solution film 4.

The inventors of the present invention experimentally ensure that the size of the microbubbles 5 generated in the developing solution film 4 is in a range of several µm to several tens of µm. The microbubbles 5 in this size are positioned on the surface of the photoresist film 2 referred to as a laminar sub-layer where the flow is hardly disturbed. It is conceivable that the microbubbles 5 barely move.

For this reason, in order to defoam the microbubbles 5, it is effective to set the film thickness of the developing solution film 4 to less than the size of the microbubbles 5. If the film thickness of the developing solution film 4 is set to 6 µm or less, most of the microbubbles 5 are defoamed. However, there is a limit to reduce the thickness. The reason is that when moisture is evaporated in the developing solution film 4 and the developing solution 3 increases in concentration, uneven development may occur. In FIG. 2, a developing solution concentration rise limit is indicated by an alternate long and short dashed line. Moreover, a diagonally shaded area above the alternate long and short dashed line indicating the developing solution concentration rise limit where the film thickness of the developing solution film 4 is 6 µm or less is a region in which defoaming is allowed without a rise in the concentration of the developing solution.

For example, when the number of revolutions of the spin chuck 11 is 1000 rpm and revolution time is prolonged for more than 10 seconds, the film thickness of the developing solution film 4 is reduced to approximately 2 µm. In this case, it will exceed the developing solution concentration rise limit, so that there is a strong possibility that uneven development occurs. To prevent this, there is the step in FIG. 1D as described later. In a case where the number of revolutions of the spin chuck 11 is increased to more than 1000 rpm, the film thickness of the developing solution film 4 becomes thinner than the case where the number of revolutions is 1000 rpm. However, the time allowed for revolution becomes a shorter period of time. For example, in a case where the number of revolutions of the spin chuck 11 is 4000 rpm, the film thickness of the developing solution film 4 can be reduced to approximately 1 µm, with 3 seconds allowed for revolution. However, as the time allowed for revolution becomes a shorter period of time, it becomes more difficult to control the revolution time with the spin chuck 11.

The thin developing solution film 4 of 6 µm at maximum in which most of the microbubbles 5 are defoamed prevents the microbubbles 5 from adhering to the surface of the photoresist film 2 even if the developing solution 3 is dropped in the subsequent step.

Returning to the description of FIG. 1C, when the motor connected to the spin chuck 11 is rotated to rotate the silicon carbide semiconductor substrate 1, the revolution time t or the number of revolutions ω of the spin chuck 11 is obtained in an expression below.

$$h = 1/\sqrt{4kt}$$

$$k = \rho\omega^2/3\eta \qquad \text{[Math 1]}$$

Here, h, ρ, and η represent film thickness, gravity, and viscosity, respectively.

In this manner, the film thickness of the developing solution film 4 is set to 6 µm or less and the revolution time t is set in accordance with the number of revolutions ω, so that the film thickness of the developing solution film 4 is less than the size of the microbubbles 5, thereby defoaming the microbubbles 5. Furthermore, this prevents the occurrence of uneven development which is generated because the film thickness of the development solution film 4 is too thin. The state is kept on waiting for the predetermined time, and subsequently, the rinse solution is dropped. This decreases the developing solution in concentration, and the developing solution film 4 is eventually replaced with the rinse solution to stop the development.

In a case of reducing the film thickness of the development solution film 4 to approximately 1 µm because the size of the microbubbles 5 to be defoamed is small, moisture is evaporated and the developing solution increases in concentration, whereby there is a strong possibility that uneven development occurs. To prevent this, as shown in FIG. 1D, it is preferable to drop the developing solution 3 again immediately after reducing the film thickness of the developing solution film 4 (step (c)). In this manner, the time of immersion in the developing solution 3 having a high concentration is reduced, which allows for a uniform developing process.

As described above, in the method for manufacturing the silicon carbide semiconductor device according to the first preferred embodiment, the developing solution immersing process is provided with step (a) of dropping the developing solution 3 on the silicon carbide semiconductor substrate 1 and forming the developing solution film 4 so as to have the film thickness of more than 6 µm, and step (b) of reducing the film thickness of the developing solution film 4 to 6 µm or less.

Therefore, the developing solution film 4 is reduced to 6 µm or less which is less than the microbubbles 5 adhered when dropping the developing solution 3 on the silicon carbide semiconductor substrate 1. Consequently, the microbubbles 5 in the developing solution film 4 can be further reduced, and thus the pattern defects can be further reduced. As a result, yields of the silicon carbide semiconductor device can be improved.

In step (b), to reduce the film thickness of the developing solution film 4 in the range of 1 µm to 6 µm, as shown in FIG. 2, a rise in the concentration of the developing solution 3 can be suppressed, and thus the occurrence of uneven development can be suppressed.

In step (b), in a case where the silicon carbide semiconductor substrate 1 is rotated at 1000 rpm, for example, in a case where the film thickness of the developing solution film 4 is reduced to approximately 2 µm, the revolution time of the spin chuck 11 is more than 10 seconds which is a relatively long period of time. Thus, it is not difficult to control the revolution time with the spin chuck 11.

In step (b), to satisfy the expression as above, the revolution time t of the silicon carbide semiconductor substrate 1 can be easily set to the revolution time t which achieves a desirable film thickness of the developing solution film 4 based on the expression.

In step (c), the developing solution 3 is dropped again on the silicon carbide semiconductor substrate 1. In order to increase the film thickness of the developing solution film 4 which has been reduced in step (b), moisture is evaporated to reduce the time of immersion in the developing solution 3 having a high concentration, which allows for the uniform developing process. Furthermore, the thin developing solution film 4 of 6 µm at maximum without the microbubbles 5 prevents the microbubbles 5 from adhering to the surface of the photoresist film 2 even if the developing solution 3 is subsequently dropped in any ways.

Second Preferred Embodiment

Next, a method for manufacturing a semiconductor device according to a second preferred embodiment is described. FIGS. 3A, 3B, 3C, and 3D are diagrams showing the method for manufacturing the semiconductor device according to the second preferred embodiment. In the second preferred embodiment, the same components as those described in the first preferred embodiment are denoted by the same references, which are not described here.

In the method for manufacturing the semiconductor device according to the second preferred embodiment, the film thickness of the developing solution film 4 formed on the silicon carbide semiconductor substrate 1 is reduced with use of a blade 13 instead of rotating the silicon carbide semiconductor substrate 1 in step (b).

Figure 3A:
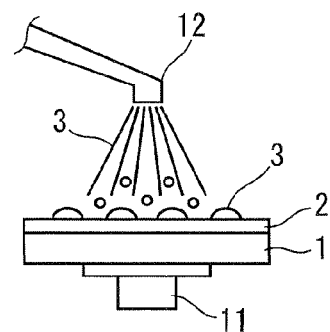
FIGS. 3A, 3B, 3C, and 3D are diagrams showing a method for manufacturing a semiconductor device according to a second preferred embodiment.
Figure 3B:
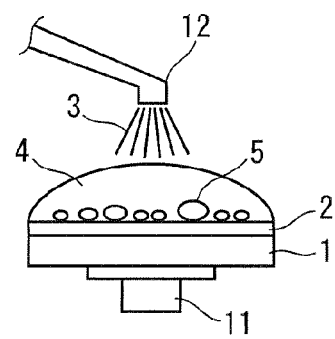

As shown in FIG. 3A, the silicon carbide semiconductor substrate 1 is fixed on the spin chuck 11 by means of vacuum force and the photoresist film 2 is formed on the silicon carbide semiconductor substrate 1. The developing solution 3 is dropped from the nozzle 12 on the silicon carbide semiconductor substrate 1 on which the photoresist film 2 is formed. As shown in FIG. 3B, the developing solution 3 is sufficiently puddled on the silicon carbide semiconductor substrate 1 so as to form the developing solution film 4 having the film thickness of more than 6 µm (step (a)). The microbubbles 5 are generated in the developing solution film 4, and some of the microbubbles 5 adhere to the surface of the photoresist film 2. The size of the microbubbles 5 is several µm to several tens of µm.

Figure 3C:
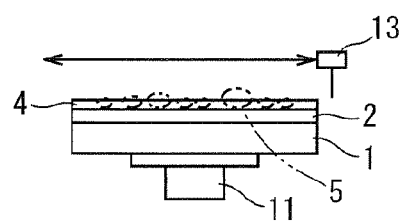

Subsequently, the blade 13 is moved along the surface of the developing solution film 4 on the silicon carbide semiconductor substrate 1 (step (b)). A tip portion of the blade 13 comes in contact with the surface of the developing solution film 4, and the movement of the blade 13 pushes outward the surface side of the developing solution film 4 on the silicon carbide semiconductor substrate 1, whereby the film thickness of the developing solution film 4 can be reduced in the range of 1 µm to 6 µm. As shown in FIG. 3C, the film thickness of the developing solution film 4 is less than the size of the microbubbles 5, which leads to defoaming of the microbubbles 5. The state is kept on waiting for the predetermined time, and subsequently, the rinse solution is dropped. This decreases the concentration of the development solution, and the developing solution film 4 is eventually replaced with the rinse solution to stop the development.

Figure 3D:
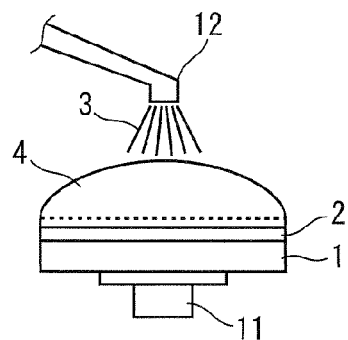

In a case where the size of the microbubbles 5 to be defoamed is small and the film thickness of the development solution film 4 needs to be reduced to approximately 1 µm, moisture is evaporated and the developing solution increases in concentration, whereby there is a strong possibility that uneven development occurs. To prevent this, as shown in FIG. 3D, it is preferable to drop the developing solution 3 again immediately after reducing the film thickness of the developing solution film 4 (step (c)). In this manner, the time of immersion in the developing solution 4 having a high concentration is reduced, which allows for the uniform developing process.

As described above, in the method for manufacturing the semiconductor device according to the second preferred embodiment, in step (b), the blade 13 is moved along the surface of the developing solution film 4 formed on the silicon carbide semiconductor substrate 1. Consequently, it is possible to reduce the film thickness of the developing solution film 4 in the range of 1 µm to 6 µm. For this reason, the microbubbles 5 can be further reduced, and thus the pattern defect can be further reduced. Moreover, suppressing a rise in the concentration of the developing solution 3 can suppress the occurrence of uneven development.

In step (c), the developing solution 3 is dropped again on the silicon carbide semiconductor substrate 1. In order to increase the film thickness of the developing solution film 4 which has been reduced in step (b), moisture is evaporated to reduce the time of immersion in the developing solution 3 having a high concentration, which allows for the uniform developing process. Furthermore, the thin developing solution film 4 of 6 µm at maximum without the microbubbles 5 prevents the microbubbles 5 from adhering to the surface of the photoresist film 2 even if the developing solution 3 is subsequently dropped in any ways.

In the first and second preferred embodiments, the case where the present invention is applied to the silicon carbide semiconductor device as an example of a semiconductor device is described. The present invention is widely applicable to a semiconductor device including other compound semiconductor.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, comprising a photolithography process, wherein said photolithography process includes a developing solution immersing process, and
    said developing solution immersing process includes the steps of:
        (a) dropping a developing solution on a semiconductor substrate and forming a developing solution film so as to have a film thickness of more than 6 μm; and
        (b) reducing the film thickness of said developing solution film to 6 μm or less.

2. The method for manufacturing a semiconductor device according to claim 1, wherein in said step (b), the film thickness of said developing solution film is reduced in a range of 1 μm to 6 μm.

3. The method for manufacturing a semiconductor device according to claim 2, wherein said developing solution immersing process further includes the step of (c) dropping a developing solution again on said semiconductor substrate and increasing the film thickness of said developing solution film more than the film thickness in said step (b) which has been reduced.

4. The method for manufacturing a semiconductor device according to claim 2, wherein in said step (b), said semiconductor substrate is rotated at 1000 rpm.

5. The method for manufacturing a semiconductor device according to claim 4, wherein in said step (b), revolution time t of said semiconductor substrate satisfies an expression below in which h, $\rho$, $\omega$, and $\eta$ represent film thickness, gravity, the number of revolutions, and viscosity, respectively $$h = 1/\sqrt{4kt}$$

$$k = \rho\omega^2/3\eta.$$

6. The method for manufacturing a semiconductor device according to claim 2, wherein in step (b), a blade is moved along a surface of said developing solution film formed on said semiconductor substrate.

7. The method for manufacturing a semiconductor device according to claim 1, wherein said semiconductor device is a silicon carbide semiconductor device.

* * * * *